(12) United States Patent
Chen et al.

(10) Patent No.: US 11,864,341 B1
(45) Date of Patent: Jan. 2, 2024

(54) ADAPTABLE SUNSHIELD FOR FAN-LESS ELECTRONIC COMPONENT

(71) Applicant: Quanta Computer Inc., Taoyuan (TW)

(72) Inventors: Yi-Chieh Chen, Taoyuan (TW); Yueh-Chang Wu, Taoyuan (TW); Te-Chuan Wang, Taoyuan (TW); Wei-Ju Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 2 days.

(21) Appl. No.: 17/846,776

(22) Filed: Jun. 22, 2022

(51) Int. Cl.
H05K 7/20 (2006.01)
H05K 5/03 (2006.01)
H05K 5/02 (2006.01)

(52) U.S. Cl.
CPC ....... *H05K 7/20145* (2013.01); *H05K 5/0213* (2013.01); *H05K 5/0226* (2013.01); *H05K 5/03* (2013.01); *H05K 7/2049* (2013.01); *H05K 7/20409* (2013.01)

(58) Field of Classification Search
CPC ...................................................... H05K 7/02
See application file for complete search history.

(56) References Cited

U.S. PATENT DOCUMENTS

2007/0129000 A1* 6/2007 Rasmussen ........ H05K 7/20572
454/184
2022/0258850 A1* 8/2022 Bogucki ................ B64D 29/08

FOREIGN PATENT DOCUMENTS

CN  209517841 U  10/2019
TW  201124032 A  7/2011

OTHER PUBLICATIONS

TW Office Action for Application No. 111138402, dated Apr. 27, 2023, w/ First Office Action Summary.
TW Search Report for Application No. 111138402, dated Apr. 27, 2023, w/ First Office Action.

* cited by examiner

*Primary Examiner* — Jerry Wu
(74) *Attorney, Agent, or Firm* — NIXON PEABODY LLP

(57) ABSTRACT

A sunshield to protect an equipment housing from solar heat and allow cooling from external air flow is disclosed. The sunshield includes a main plate configured to be positioned to cover a side of the equipment housing. A vent in the main plate allows air flow through the main plate to the equipment housing. A shutter is rotatable between an open position allowing air flow through the vent, and a closed position blocking air flow through the vent. A biasing mechanism provides force to bias the shutter in the closed position. The force is overcome by a predetermined level of external air flow on the shutter to rotate the shutter to the open position.

10 Claims, 11 Drawing Sheets

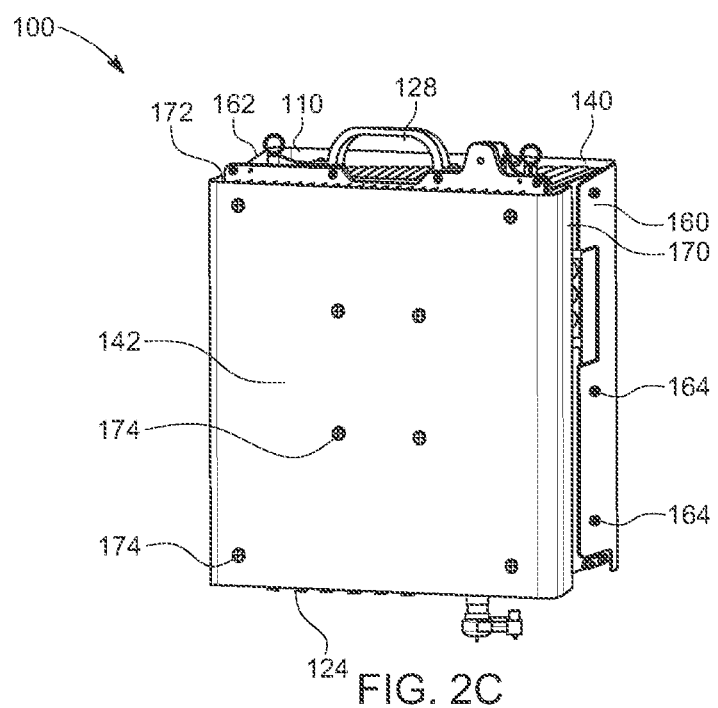

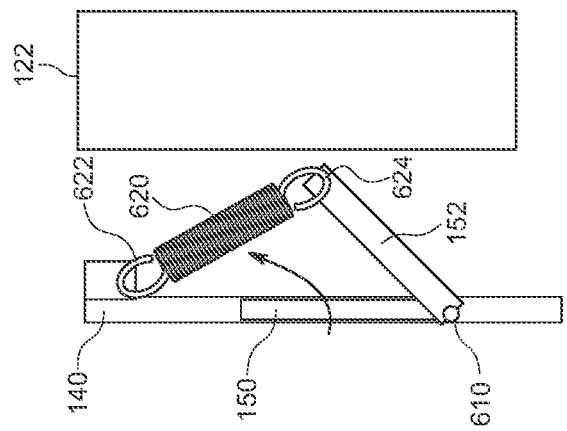
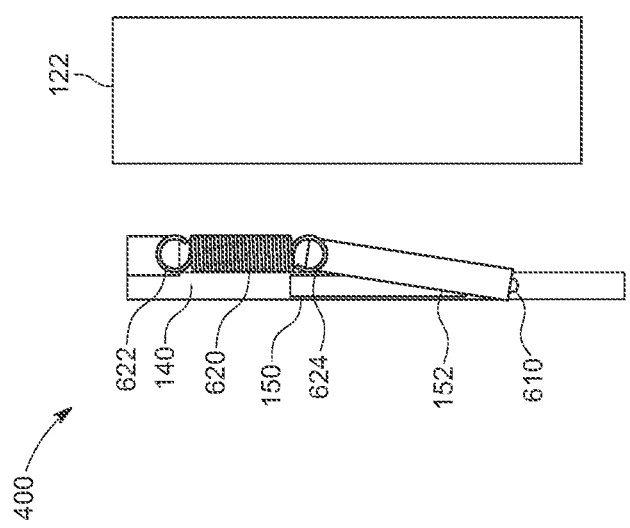

US 11,864,341 B1

ADAPTABLE SUNSHIELD FOR FAN-LESS ELECTRONIC COMPONENT

TECHNICAL FIELD

The present disclosure relates generally to cooling for fan-less components. More particularly, aspects of this disclosure relate to a sunshield with moveable shutters for protecting a chassis of a fan-less component.

BACKGROUND

The fifth generation of mobile communication technology (5th generation wireless systems, referred to as 5G) is the latest generation of mobile communication technology. The 5G technology is an extension of legacy 4G (LTE) mobile communication systems. The recent roll out of the 5G communication infrastructure has required the deployment of 5G capable components. The previous 4G system required a baseband unit (BBU), a remote radio unit (RRU), and an antenna to allow for communications between mobile devices. 5G systems for communication between mobile devices have higher speeds, lower latency, and larger Bandwidths, allowing for more connections and for more data to be processed. Such capabilities are possible through fan-less components such as radio units (RU), centralized units (CU), distributed units (DU), and active antenna units (AAU). In 5G systems the functions of the BBU in 4G systems are performed by the distributed units and centralized units, and the functions of the antenna and the RRU in 4G systems are performed by the active antenna units.

Compared with 4G, the increased transmission speed of 5G requires more components that generate greater heat. The area of heat dissipation components, such as heat sinks and fins in 5G equipment must be increased to allow 5G operation. For example, 5G base stations have 2-3 times the power consumption of 4G base stations. Higher power consumption results in greater heat generation. If a 5G base station has poor heat dissipation, work efficiency is reduced, and equipment problems such as damage, crashes, and disconnection of the network may result seriously affecting user experience.

5G DUs and AAUs are components that are typically located in outdoor environments. Outdoor electronic chassis design for DUs and AAUs requires being waterproof, dustproof, and anti-corrosive. Therefore, the chassis for 5G outdoor components is designed as a closed system and the chassis is usually designed as a heat sink to cool the electronic devices in such components. Such thermal solutions are thus a fan-less design.

These components are directly exposed to other outside weather conditions such as sunlight. The sunlight causes extra heat loading applied on surface of the component. For example, Generic Requirements for Network equipment (e.g., GR-3108 class 4), solar loading is 1120 W/m^2 in single direction. To avoid solar loading that may directly impact the electronics in the component housing, a sunshield is added to protect the component from sunlight.

FIG. 1A shows an example 5G component 10 with a prior art sunshield 12 installed on a chassis 14 with external fins 16. The chassis 14 houses various electronic components for 5G communication operations. The chassis 14 includes a connector panel 18 that includes various connectors for cables and the like. The sunshield 12 prevents solar heat from heat loading the interior of the chassis 14. However, while the sunshield 12 blocks the sun, it also blocks external air flow from wind that is required for dissipating thermal emission from the components in the chassis 14 through the fins 16.

One attempt to solve this problem is to provide venting holes in the sunshield. FIG. 1B shows an example 5G component housing 50 with another type of prior art sunshield 52. The sunshield 52 encloses the chassis of the component housing 50 and thus provides protection against solar heat. The sunshield 52 includes venting holes 54 that provide air flow to the chassis of the component housing 50. However, such venting holes 54 result in a situation wherein the chassis is at least partially exposed to sunlight through the venting holes 54. The sunlight through venting holes 254 may cause solar heat loading of the chassis.

In a sunshield 52 with venting holes 54, if there is no external air flow speed, the chassis is exposed to sunlight through the venting holes 54. The leads to a higher system temperature compared with system without ventilation. In other scenarios, where the speed of the air flow is greater than 0.2 m/s, the chassis has a lower temperature with the sunshield because of the venting holes 54. Thus, neither of the prior art sunshield designs in FIGS. 1A-1B are sufficient in all conditions. When there is little to no external air flow, the sunshield 52 in FIG. 1B is actually a worse solution than the sunshield 12 in FIG. 1A due to heat loading from sunlight that impinges through the venting holes 54. However, with air flow, the sunshield 12 in FIG. 1A is worse than the sunshield 52 in FIG. 1B due to the sunshield 12 blocking external air flow from cooling the chassis.

Thus, there is a need for a sunshield for an outdoor chassis that protects against heat loading from sunlight but allows external air flow. There is another need for a sunshield with mechanical mechanisms that allow the movement of shutters to either block the sun or allow external air flow.

SUMMARY

One disclosed example is a sunshield to protect an equipment housing from solar heat. The sunshield has a main plate configured to cover a side of the equipment housing. A vent in the main plate allows air flow through the main plate to the equipment housing. A shutter is rotatable between an open position allowing air flow through the vent, and a closed position blocking air flow through the vent. A biasing mechanism provides force to bias the shutter in the closed position. The force is overcome by a predetermined level of external air flow on the shutter to rotate the shutter to the open position A further implementation of the example sunshield is where the equipment housing includes a heat sink chassis having cooling fins in proximity to the main plate. Another implementation is where the sunshield is fabricated from stainless steel, aluminum, aluminum alloy, or plastic, and the shutter is plastic. Another implementation is where the example sunshield includes a back plate attachable to the main equipment housing. The attached back plate and main plate enclose the equipment housing. Another implementation is where the shutter is one of a plurality of shutters on the main plate, and where the vent is one of a plurality of vents on the main plate. Another implementation is where the biasing mechanism is a torsion spring having a first spring arm attached to the main plate and a second spring arm attached to the shutter. Another implementation is where the biasing mechanism is an extension spring having a first end attached to the shutter and a second end attached to the main plate. The shutter rotates on a hinge attached to a bottom edge of the vent. Another implementation is where the biasing mechanism is a counterweight attached to an arm on the shutter. The shutter rotates on a hinge attached to a bottom edge of the vent. Another implementation is where the vent has a bottom edge and an opposite top edge. The shutter rotates around the bottom edge away from the top edge. Another implementation is where the housing includes components for operation of a 5G mobile communication system.

Another disclosed example is an electronic component including a heat sink chassis enclosing heat generating electronic components. The electronic component includes a sunshield with a main plate configured to be positioned to cover a side of the heat sink chassis. The sunshield has a vent in the main plate allowing air flow through the main plate to the heat sink chassis. The sunshield has a shutter rotatable between an open position allowing air flow through the vent, and a closed position blocking air flow through the vent. A biasing mechanism provides force to bias the shutter in the closed position. The force is overcome by a predetermined level of external air flow on the shutter to rotate the shutter to the open position.

A further implementation of the example electronic component is where the heat sink chassis includes cooling fins extending from an exterior surface of the heat sink chassis in proximity to the main plate. Another implementation is where the sunshield is fabricated from stainless steel, aluminum, aluminum alloy, or plastic, and the shutter is plastic. Another implementation is where the sunshield includes a back plate attachable to the electronic component. The attached back plate and main plate enclose the heat sink chassis. Another implementation is where the shutter is one of a plurality of shutters on the main plate, and the vent is one of a plurality of vents on the main plate. Another implementation is where the biasing mechanism is a torsion spring having a first spring arm attached to the main plate and a second spring arm attached to the shutter. Another implementation is where the biasing mechanism is an extension spring having a first end attached to the shutter and a second end attached to the main plate. The shutter rotates on a hinge attached to a bottom edge of the vent. Another implementation is where the biasing mechanism is a counterweight attached to an arm on the shutter. The shutter rotates on a hinge attached to a bottom edge of the vent. Another implementation is where the vent has a bottom edge and an opposite top edge, and where the shutter rotates around the bottom edge away from the top edge. Another implementation is where the heat generating components perform functions for a 5G mobile communication system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 2C shows a front perspective view of the chassis with the example adaptable sunshield, according to certain aspects of the present disclosure;

FIG. 6A shows a side view of another example of one of the shutters of the sunshield with an extension spring biasing mechanism in a closed position, according to certain aspects of the present disclosure;

FIG. 6B shows a side view of another example of one of the shutters of the sunshield with the extension spring biasing mechanism in an open position, according to certain aspects of the present disclosure;

Figure 1A:
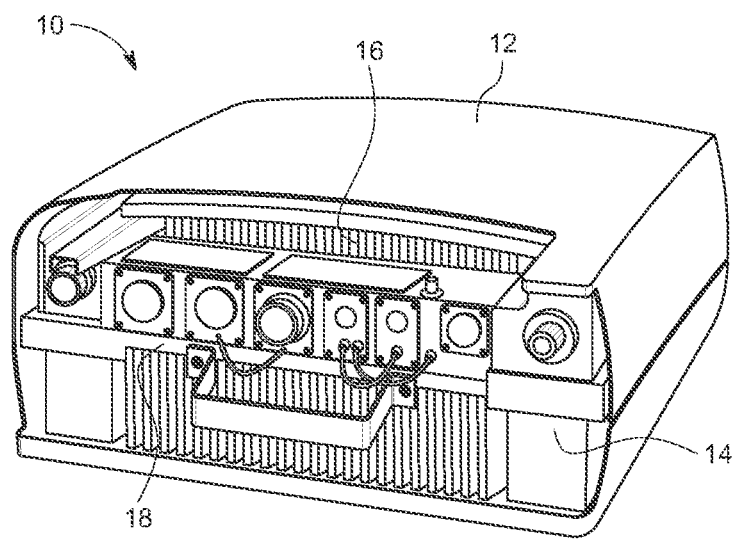
FIG. 1A is a perspective view of a telecommunications component chassis with a prior art sunshield.
Figure 1B:
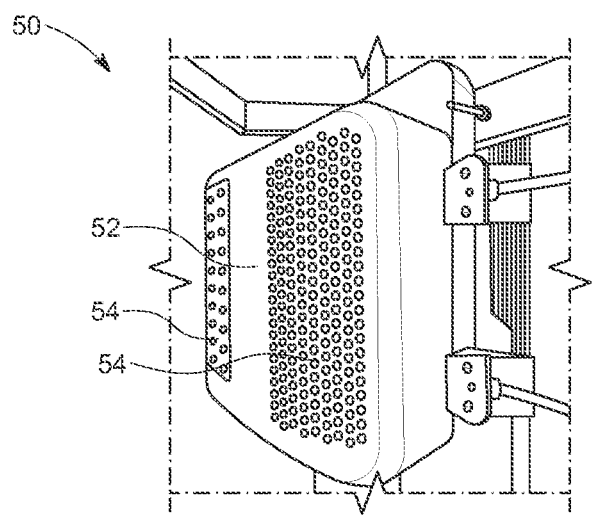
FIG. 1B is a perspective view of a telecommunications component chassis with another type of prior art sunshield with venting holes.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

The present disclosure relates to an example adaptable sunshield that can provide thermal protection in still air and non-still air conditions to a fan-less component. The adaptable sunshield has a series of shutters that are positioned to cover the chassis when there is little or no external air flow, thus protecting the chassis from solar heat. The shutters of the adaptable sunshield are moved by external air flow to allow air flow access to the chassis when there is relatively high external airflow. In this manner, solar heat load is preventing in situations with little or no external airflow by the shutters being closed by a biasing mechanism. When there is relatively high airflow, the example adaptable sunshield allows cooling from the external air flow overcoming the biasing mechanism and opening the shutters. A first type of biasing mechanism includes a torsion spring to position the shutters of the sunshield. A second type of biasing mechanism includes an extension spring to position the shutters of the sunshield. A third type of biasing mechanism includes a counter-weight to position the shutters of the sunshield.

Figure 2A:
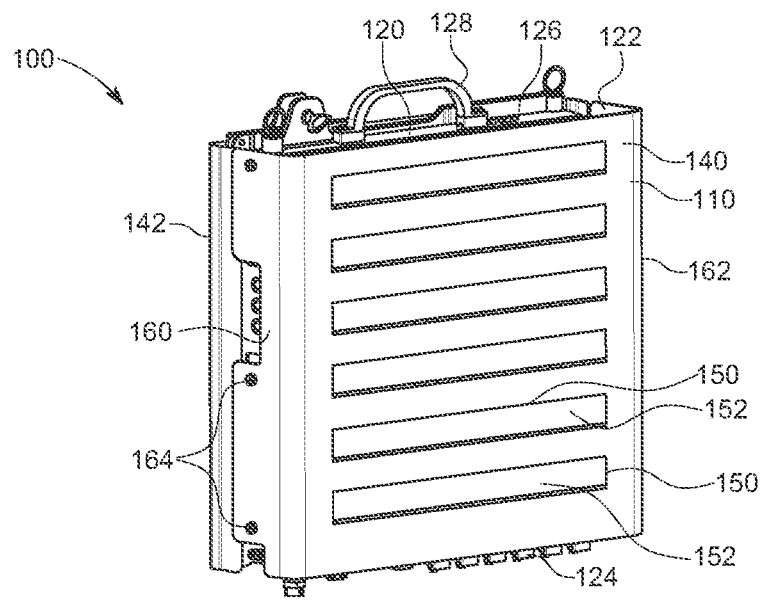
FIG. 2A shows a front perspective view of a telecommunications component chassis with an example adaptable sunshield, according to certain aspects of the present disclosure.
Figure 2B:
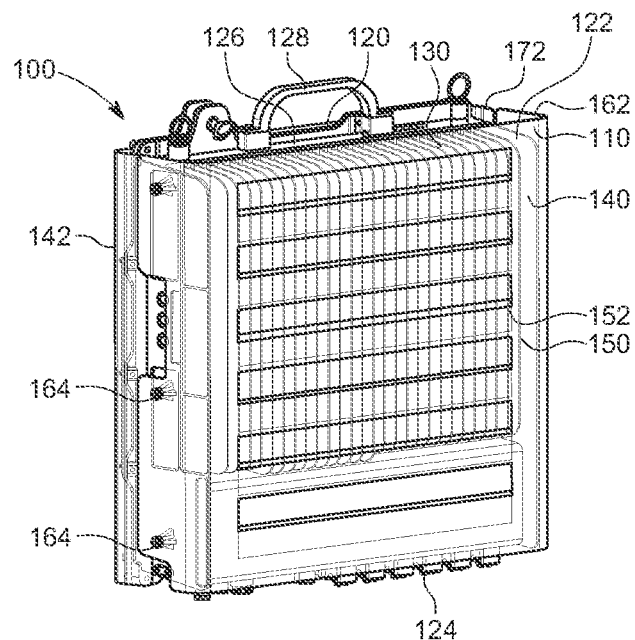
FIG. 2B shows a perspective cutaway view of the chassis for a telecommunications component with an example adaptable sunshield, according to certain aspects of the present disclosure.
Figure 2D:
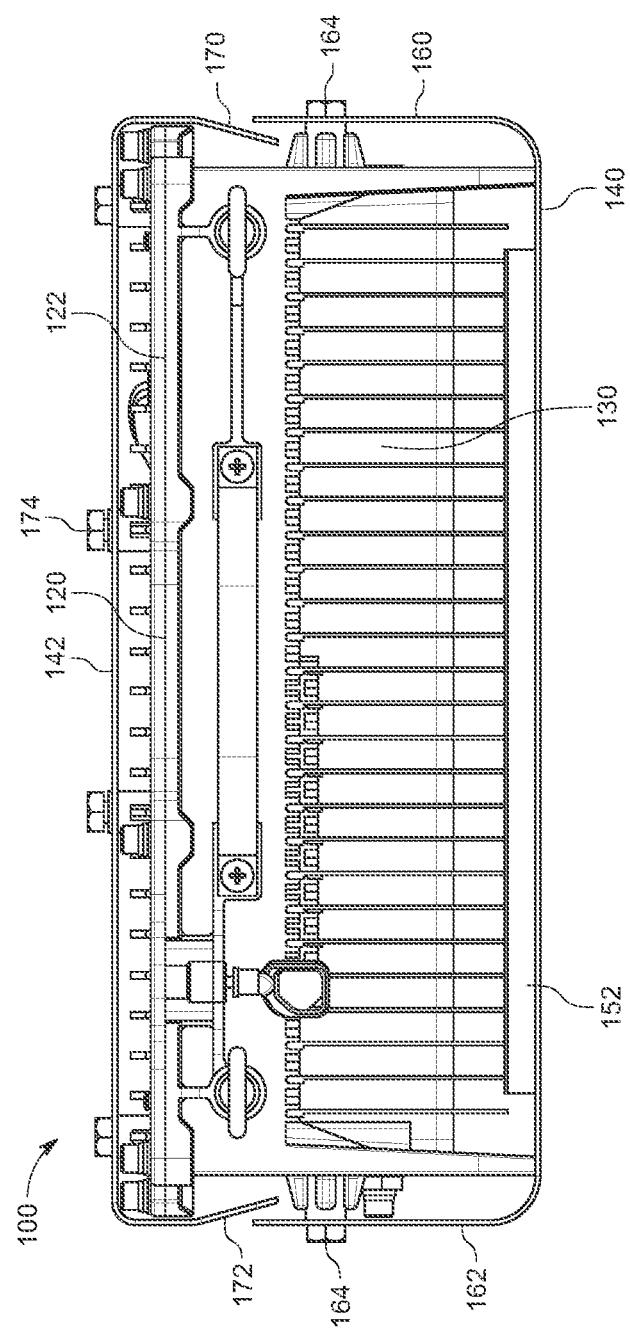
FIG. 2D shows a top perspective view of the chassis with the example adaptable sunshield, according to certain aspects of the present disclosure.
Figure 3:
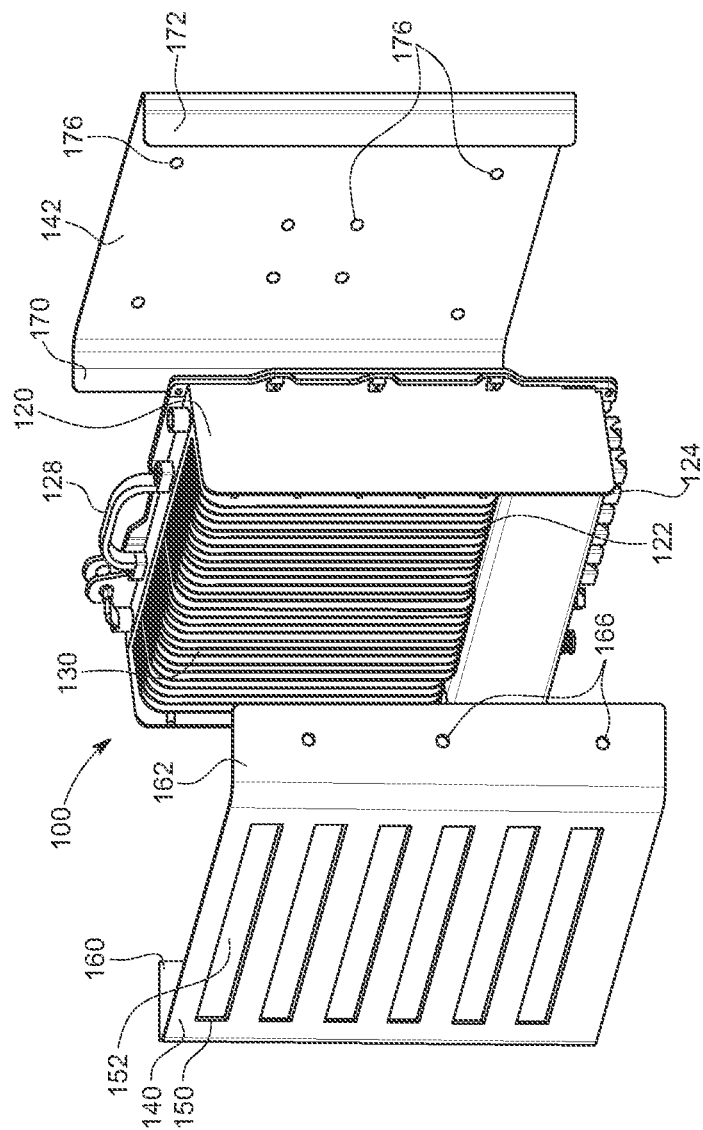
FIG. 3 shows an exploded perspective view of the chassis and the components of the example adaptable sunshield, according to certain aspects of the present disclosure.

FIG. 2A shows a front perspective view of a telecommunication equipment component 100 with an example sunshield assembly 110. FIG. 2B shows a perspective cutaway view of the example chassis for the telecommunication component 100 with the example sunshield assembly 110. FIG. 2C shows a back perspective view of the assembled equipment component 100 and the example sunshield assembly 110. FIG. 2D shows a top perspective view of the assembled equipment component 100 and the example sunshield assembly 110. FIG. 3 shows an exploded perspective view of the equipment component 100 and the components of the example sunshield assembly 110.

Referring generally to FIGS. 2A-2D and 3, the telecommunication equipment component 100 is a fan-less electronic device. In this example, the telecommunication component 100 is a 5G distributed unit (DU) that includes a housing 120, which holds a printed circuit board and other electronic components for performing 5G communication functions. As will be explained, the example sunshield assembly 110 is attached over the housing 120 to protect the housing from sunlight. The example sunshield assembly 110 may be employed in any equipment designed for outdoor use, such as other 5G telecommunication components (such as a radio unit (RU), or an active antenna unit (AAU)) that relies on a fan-less cooling system to cool its internal electronics. In this example, the DU component 100 is part of a 5G mobile communication system that relies on electronic components that require heat dissipation for proper operation.

The housing 120 includes a heat sink chassis 122, a bottom connector panel 124, and an opposite top panel 126 with a handle 128. Connection cables and connectors may be attached to connectors on the connector panel 124 to provide power and electrical signals to components on the printed circuit board and other electronics within the housing 120. The electronic components will typically include a processor, such as a CPU, double data rate (DDR) memory, physical layer key generation circuits, network interfaces, power supply, and other components. The connectors may include small form-factor pluggable (SFP) optical and RJ45 type connectors. The components inside the housing 120 generate heat, which are absorbed by the heat sink chassis 122.

The heat sink chassis 122 allows transmission of heat generated by the internal electronics of the component 100 to the ambient exterior environment. The heat sink chassis 122 includes a series of external fins 130 that assist in dissipating the ambient heat to the external environment. However, since the heat sink chassis 122 is constructed of heat absorbent material such as aluminum or aluminum alloy, it is susceptible to absorbing heat from sunlight and channeling heat back into the housing 120. As will be explained, the example sunshield assembly 110 prevents sunlight from providing undesirable solar heat loading to the heat sink chassis 122.

The heat sink chassis 122 has a generally flat interior surface that absorbs heat that is transmitted through the interior electronic components of the component 100. A part of the interior surface of the heat sink chassis 122 may serve as a contact surface in thermal communication with components on the circuit board such as a CPU. Heat is funneled from the interior surface to an opposite exterior surface of the heat sink chassis 122. The vertical fins 130 extend from the exterior surface. The vertical fins 130 increase the surface area available to dissipate heat from the heat sink chassis 122 to the ambient environment.

The example sunshield assembly 110 is shown in FIGS. 2A, 2B, and 3 attached to the component 100 to shield the heat sink chassis 122. The sunshield assembly 110 includes a main plate 140 and a back plate 142. The main plate 140 and back plate 142 may be separately attached on the housing 120. In this example, the main plate 140 and back plate 142 are attached to the housing 120 via screws. Other attachment mechanisms may also be used to attach the main plate 140 and the back plate 142 to the housing 120.

Figure 4B:
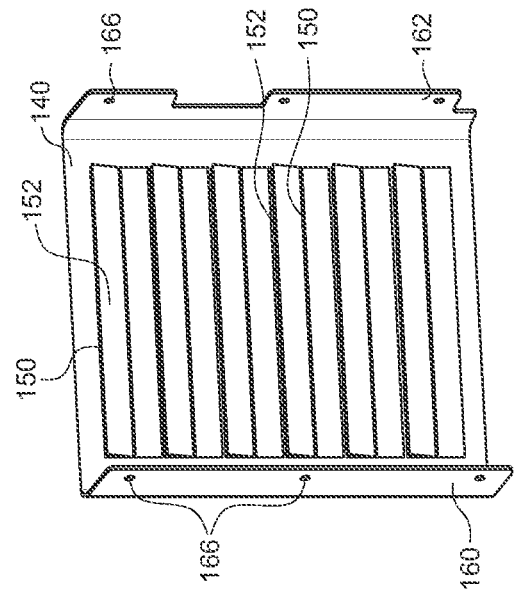
FIG. 4B shows a back perspective view of the main plate of the adaptable sunshield in FIG. 2A, according to certain aspects of the present disclosure.
Figure 4A:
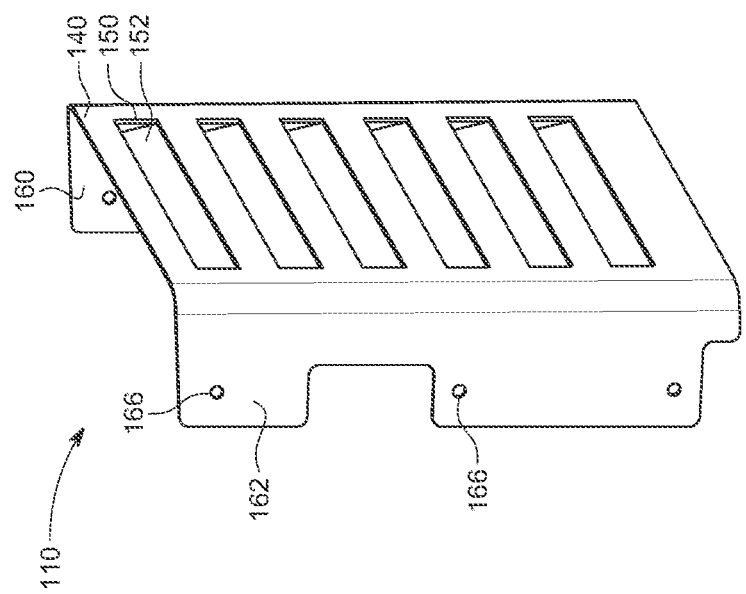
FIG. 4A shows a front perspective view of the main plate of the adaptable sunshield in FIG. 2A, according to certain aspects of the present disclosure.

FIG. 4A is a front perspective view of the main plate 140 of the sunshield assembly 110. FIG. 4B is a back perspective view of the main plate 140. As may be seen in FIGS. 2A, 2B, 3, and 4, the main plate 140 includes a series of rectangular vents 150 with corresponding rotating shutters 152. The vents 150 allow air to flow through the main plate 140. In this example, the plate 140 is fabricated from stainless steel, plastic, aluminum or aluminum alloy. The rotating shutters 152 may be fabricated from lightweight material such as plastic. The rotating shutters 152 rotate between a closed position blocking the vents 150 and a partially open position that allows air flow through the vents 150. Similar vents and rotating shutters may be formed on the back plate 142 if additional external cooling is available from the back plate 142.

The main plate 140 is attached to two side tabs 160 and 162. The side tabs 160 and 162 are joined at respective opposite side edges of the main plate 140. In this example, the main plate 140 and side tabs 160 and 162 are fabricated from a single piece. The main shield plate 140 and side tabs 160 and 162 are inserted over the heat sink chassis 122 and attached so the main shield plate 140 shields the heat sink chassis 122 as shown in FIGS. 2A and 2B. The side tabs 160 and 162 are angled perpendicularly relative to the main plate 140. Screws 164 are inserted in screw holes 166 in each of the side tabs 160 and 162 to allow attachment of the main plate 140 and side tabs 160 and 162 to the housing 120. In this example, there are three equidistant screw holes 166 in each of the side tabs 160 and 162. Other arrangements and numbers of screw holes may be used.

The back plate 142 also includes two side tabs 170 and 172 that are angled perpendicularly from the back plate 142. The ends of the tabs 170 and 172 are angled to allow for air flow to the sides of the equipment housing 120 in a gap formed with the respective tabs 160 and 162. A series of screws 174 are inserted in screw holes 176 that allow attachment of the back plate 142 and side tabs 170 and 172 to the housing 120. In this example, the back plate 142 has four screw holes 176 that are in the middle of the back plate 142 and four screw holes 176 at each corner. Other arrangements and numbers of screw holes may be used. The main shield plate 140 is attached to the housing 120 to align the position of the side tab 160 with the position of the side tab 170 and aligning the position of the side tab 162 with the position of the side tab 172.

In this example, the shutters 152 cover the vents 150 in conditions where the external air flow has a speed that is under a predetermined velocity. When the speed of the external airflow exceeds a predetermined velocity (e.g., 2 m/s), the external air flow pushes the shutters 152 to rotate toward the interior of the main plate 140 thereby allowing external air flow to be guided through the vents 150 to the fins 130 of the heat sink chassis 122.

Figure 5B:
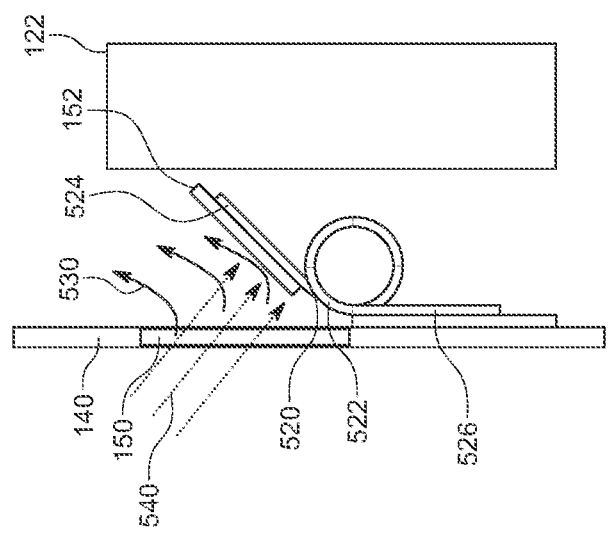
FIG. 5B shows a side view of one example of one of the shutters of the sunshield with the torsion spring biasing mechanism in an open position, according to certain aspects of the present disclosure.
Figure 5A:
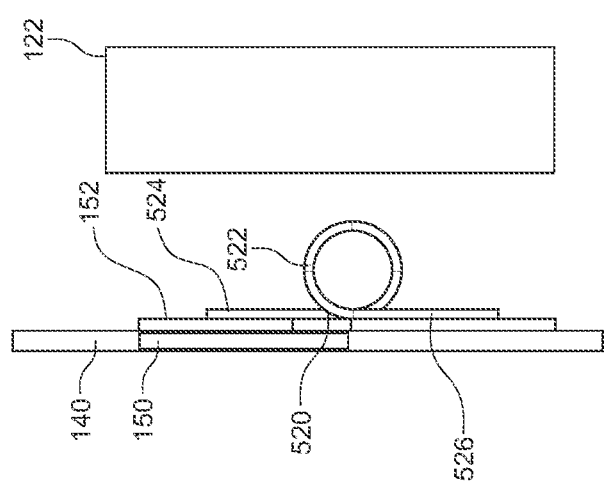
FIG. 5A shows a side view of one example of one of the shutters of the sunshield with a torsion spring biasing mechanism in a closed position, according to certain aspects of the present disclosure.
Figure 5C:
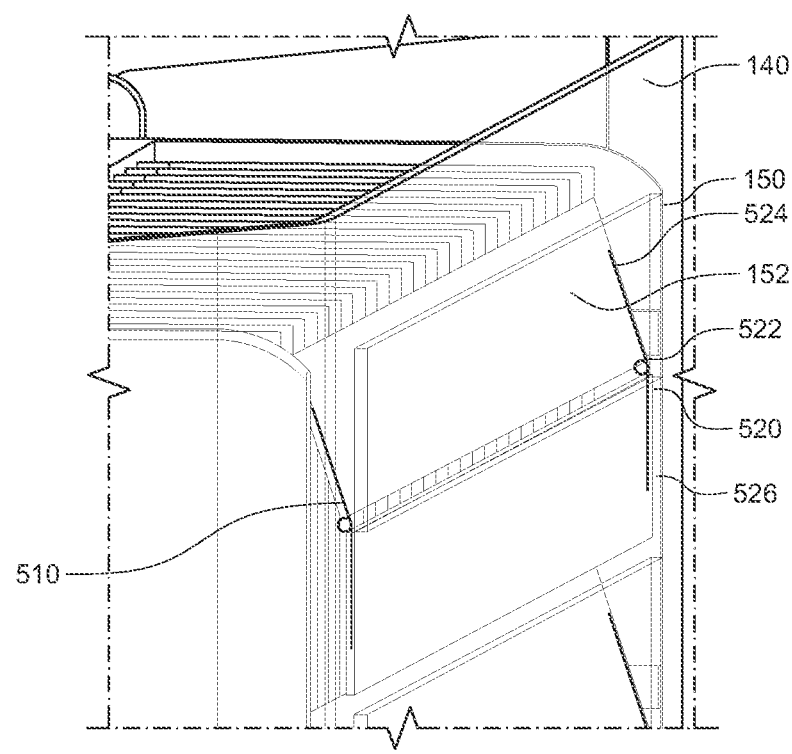
FIG. 5C shows a perspective view of one example of one of the shutters of the sunshield with the torsion spring biasing mechanism in an open position, according to certain aspects of the present disclosure.

There may be a variety of biasing mechanisms to keep the shutters 152 closed when air flow is still or low. When air flow exceeds a certain velocity, it overcomes the force applied by the biasing mechanism, and thereby rotates the shutters 152 open. This provides external air flow to be guided through the vents 150. FIG. 5A shows a side view of one of the shutters 152 relative to the shield plate 140 when the shutter 152 is closed from a biasing mechanism based on a torsion spring. FIG. 5B shows a side view of one of the shutters 152 relative to the main plate 140 when the shutter 152 is forced open by external wind flow that overcomes the force by the torsion spring biasing mechanism. FIG. 5C shows a perspective view of one of the shutters 152 relative to the shield plate 140 when the shutter 152 is open from external air flow.

As shown in FIG. 5C, the sides of the shutter 152 are attached to two respective torsion springs 510 and 520. The shutter 152 is forced open by external wind flow that overcomes the force by the torsion spring biasing mechanism. This allows external air flow to enter through the vent 150. In this example, the torsion spring 520 has a coil 522 having one spring arm 524 attached to the shutter 152 and a second spring arm 526 attached to the interior surface of the main plate 140. The other torsion spring 510 has similar parts to the torsion spring 520. The spring force of the torsion springs 510 and 520 force the shutter 152 to cover the vent 150 as shown in FIG. 5A.

When there is air flow through vent 150, the shutter 152 sustains a force pushed by air flow represented by arrows 530 to overcome the spring force. The shutter 152 is thus moved to allow access to the vent 150 and the air flow dissipates system heat from the heat sink chassis 122. On the other hand, if air flow is still, the shutter would be original position from the spring force and it can help to block solar radiation. Since the shutter 152 is positioned at an angle with a rotation point at the bottom edge of the vent 150 as shown in FIG. 5B, the angle of the shutter 152 when open helps block sunlight that impinges through the vent 150 as shown by arrows 540. This arrange and prevents direct solar radiation exposure even when external air flow keeps the shutter 152 open.

FIG. 6A shows a side view of one of the shutters 152 relative to the shield plate 140 when the shutter 152 is closed from a biasing mechanism based on an extension spring. FIG. 6B shows a side view of one of the shutters 152 relative to the main plate 140 when the shutter 152 is forced open by external wind flow that overcomes the force by the extension spring biasing mechanism. In this example, the shutter 152 is mounted on a hinge 610 on the bottom edge of the vent 150. The hinge 610 allows the shutter 152 to rotate away from the top edge of the vent 150. An extension spring 620 has one end that has a first loop 622 attached to the main plate 140. The opposite end of the extension spring 620 has a second loop 624 is attached to the opposite end of the shutter 152 from the hinge 610. Thus, the extension spring 620 exerts spring force to bias the shutter 152 to block the vent 150 as shown in FIG. 6A.

When air flows against the shutter 152, the force of the air flow overcomes the spring force of the extension spring 620. The shutter 152 is thus rotated on the hinge 610 to allow access to the vent 150 and the air flow dissipates system heat from the heat sink chassis 122 as shown in FIG. 6B. When the air flow is still, the shutter 152 blocks the vent 150 from the spring force of the extension spring 620 and thus may block solar radiation. Since the shutter 152 is positioned at an angle with the hinge 610 at the bottom edge of the vent 150 as shown in FIG. 6B, the angle of the shutter 152 when open helps block sunlight that impinges through the vent 150, and prevents direct solar radiation even when air flow keeps the shutter 152 open.

Figure 7B:
FIG. 7B shows a cross-section view of one of the shutters of the example sunshield with the counterweight biasing mechanism in an open position, according to certain aspects of the present disclosure.
Figure 7A:
FIG. 7A shows a side view of yet another example of one of the shutters of the sunshield with a counter-weight biasing mechanism in a closed position, according to certain aspects of the present disclosure.

FIG. 7A shows a side view of one of the shutters 152 relative to the shield plate 140 when the shutter 152 is closed from a biasing mechanism based on a counterweight. FIG. 7B shows a side view of one of the shutters 152 relative to the main plate 140 when the shutter 152 is forced open by external wind flow that overcomes the force by the counterweight biasing mechanism.

In this example, the shutter 152 rotates around a hinge 710 on the bottom edge of the vent 150. The shutter 152 is at a slight angle when in the closed position to mostly block the vent 150. The shutter 152 includes an extension arm 720 that holds a counterweight 722. Thus, gravitational force pulls the counterweight 722 down, thus rotating the shutter around the hinge 710 to the closed position, blocking the vent 150 as shown in FIG. 7A. When external air flow exceeds a certain velocity, the air flow creates sufficient force to overcome the gravitation force on the counterweight 722. Thus, the shutter 152 rotates around the hinge 710 to the open position from the air flow force as shown in FIG. 7B.

Figure 8:
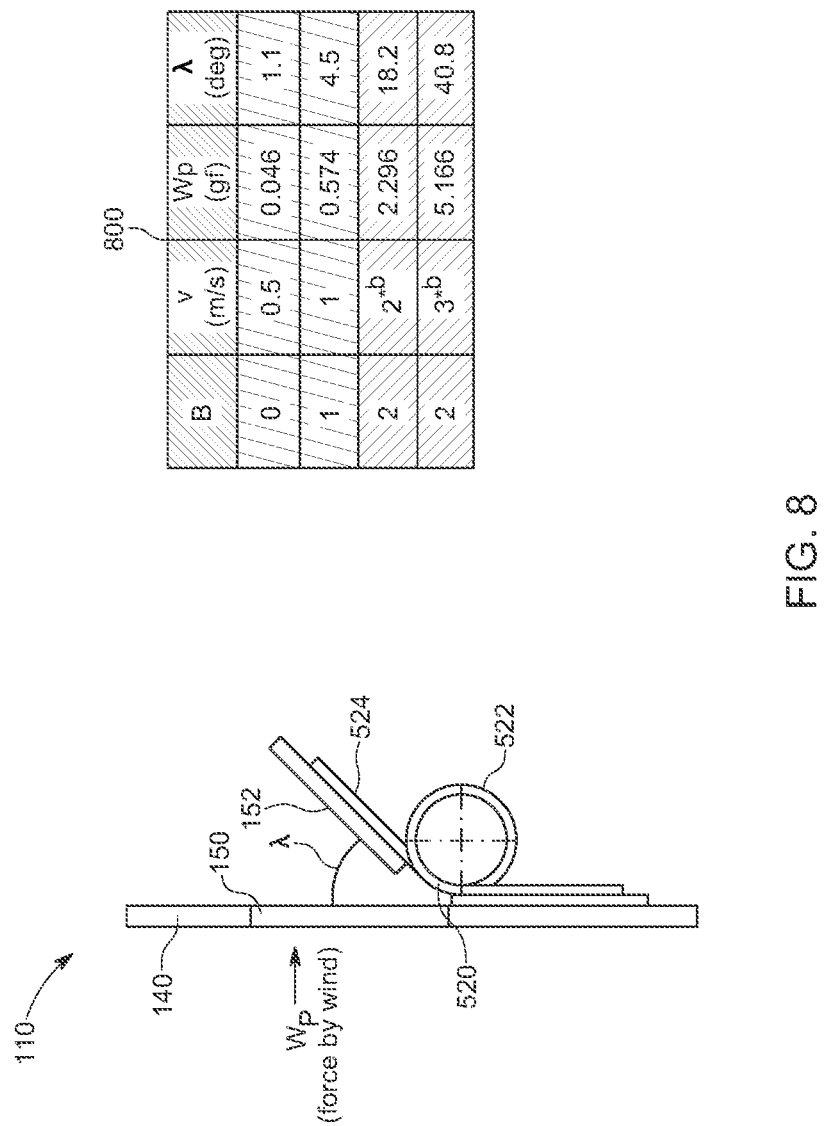
FIG. 8 is a diagram of parameters for the torsion biasing mechanism in FIG. 5A of the example adaptable sunshield and a table of testing results based on the parameters, according to certain aspects of the present disclosure.

FIG. 8 shows a table 800 with test results of the example sunshield assembly with the torsion spring biasing mechanism in FIGS. 5A and 5B. Like elements in FIG. 8 are labeled with the same reference numerals in FIG. 5A. To prove the feasibility of the example adaptable sunshield, the following scenario was examined to calculate the wind force. Based on the calculation result, the shutter 152 can be successfully opened when air flow speed is over 2 m/s. A thermal simulation tool was used to check thermal performance for this design.

In this test, the shutter 152 has a dimension of 300×30 mm. The torsion spring 520 is manufactured from SUS304 stainless steel with a coil diameter of 2 mm, and the spring arms 524 and 526 being 15 mm long and 0.2 mm in diameter. The spring constant, k, is 0.95 g*mm/deg. The table 800 shows the Beaufort scale number, B, the air flow speed in m/s, v, the air force applied to the shutter, Wp, and the angle between the shutter 152 and the main plate 140, λ. In this example, the air force from external air flow is evaluated from dynamic pressure expressed as ½ ρv². The angle between the shutter 152 and the base plate 140, λ, changes based on the air flow speed. The angle, λ, of the shutter 152 is calculated from the formula:

$$\lambda = \frac{Wp \times (\text{Arm } 1)}{k \times 2}$$

where Arm 1 is the length of the spring arm 524. As shown in the table 800, the shutter 152 is opened at approximately 18 degrees when air velocity is 2 m/s (4.5 miles per hour). The shutter 152 is opened at approximately 40 degrees when the air velocity is 3 m/s (6.7 miles per hour).

The biasing mechanisms may be tuned to specific air flow velocities using the calculations explained above. Thus, springs of varying spring constants may be provided to adjust the necessary wind velocity to open the shutter 152. Alternatively, the weight of the counterweight and/or the position from the hinge may be adjusted to adjust the necessary wind velocity to open the shutter 152. Further, the biasing mechanisms may be adjusted to accommodate shutters of different areas to open at a specific air velocity. The above described shutter and biasing mechanisms are designed to block solar radiation under still air conditions and allow access to the vents when there is wind-force that overcomes the biasing mechanism.

The example adaptable sunshield with vents and moveable shutters can have the advantages of a venting solar shield when an environment is not a still air condition (air flow speed over 2~3 m/s in most outdoor environments). If the sunshield is in a still air condition, the sunshield blocks solar radiation. The example adaptable sunshield has the both advantages of "venting" and "not venting" for conventional types of sunshields.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A sunshield to protect an equipment housing from solar heat, the sunshield comprising: a main plate with a plurality of tabs configured to cover a side of the equipment housing; a housing including a heat sink chassis having cooling fins in proximity to the main plate; a back plate attachable to the electronic component, the back plate having two side tabs that are angled perpendicularly from the back plate and formed a gap with the tabs of the main plate to allow an airflow, wherein the back plate and the main plate, when attached to the electronic component, enclose the heat sink chassis and the plurality of tabs fixed to both sides of the heat sink chassis; a vent in the main plate allowing air flow through the main plate to the equipment housing; a shutter rotatable between an open position allowing air flow through the vent, and a closed position blocking air flow through the vent; and a biasing mechanism providing force to bias the shutter in the closed position, wherein the force is overcome by a predetermined level of external flow of air on the shutter to rotate the shutter to the open position; and wherein the biasing mechanism is a torsion spring having a first spring arm attached to the main plate and a second spring arm attached to the shutter.

2. The sunshield of claim 1, wherein the sunshield is fabricated from stainless steel, aluminum, aluminum alloy, or plastic and wherein the shutter is plastic.

3. The sunshield of claim 1, wherein the shutter is one of a plurality of shutters on the main plate, and wherein the vent is one of a plurality of vents on the main plate.

4. The sunshield of claim 1, wherein the vent has a bottom edge and an opposite top edge, wherein the shutter rotates around the bottom edge away from the top edge.

5. The sunshield of claim 1, wherein the housing includes components for operation of a 5G mobile communication system.

6. An electronic component, comprising: a heat sink chassis enclosing heat generating electronic components; and a sunshield including: a main plate configured to be positioned to cover a side of the heat sink chassis; a housing including a heat sink chassis having cooling fins in proximity to the main plate; a back plate attachable to the electronic component, the back plate having two side tabs that are angled perpendicularly from the back plate and formed a gap with the tabs of the main plate to allow an airflow, wherein the back plate and the main plate, when attached to the electronic component, enclose the heat sink chassis and the plurality of tabs fixed to both sides of the heat sink chassis; a vent in the main plate allowing air flow through the main plate to the heat sink chassis; a shutter rotatable between an open position allowing air flow through the vent, and a closed position blocking air flow through the vent; and a biasing mechanism providing force to bias the shutter in the closed position, wherein the force is overcome by a predetermined level of external flow of air on the shutter to rotate the shutter to the open position; and wherein the biasing mechanism is an extension spring having a first end attached to the shutter and a second end attached to the main plate, wherein the shutter rotates on a hinge attached to a bottom edge of the vent.

7. The electronic component of claim 6, wherein the sunshield is fabricated from stainless steel, aluminum, aluminum alloy, or plastic, and wherein the shutter is plastic.

8. The electronic component of claim 6, wherein the shutter is one of a plurality of shutters on the main plate, and wherein the vent is one of a plurality of vents on the main plate.

9. The electronic component of claim 6, wherein the vent has a bottom edge and an opposite top edge, wherein the shutter rotates around the bottom edge away from the top edge.

10. The electronic component of claim 6, wherein the heat generating electronic components perform functions for a 5G mobile communication system.

* * * * *